(12) United States Patent
Tong et al.

(10) Patent No.: US 7,936,186 B1
(45) Date of Patent: May 3, 2011

(54) METHOD AND APPARATUS FOR CORRECTING DUTY CYCLE VIA CURRENT MODE LOGIC TO CMOS CONVERTER

(75) Inventors: Guluke Tong, San Ramon, CA (US); Sitaraman V. Iyer, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/631,297

(22) Filed: Dec. 4, 2009

(51) Int. Cl.
*H03K 19/086* (2006.01)
(52) U.S. Cl. .................................... 326/127
(58) Field of Classification Search ............ 326/127
See application file for complete search history.

(56) References Cited

U.S. PATENT DOCUMENTS

| | | | | |
|---|---|---|---|---|
| 6,211,699 B1* | 4/2001 | Sudjian | ............ | 326/66 |
| 2008/0001633 A1* | 1/2008 | Narathong et al. | ............ | 326/87 |
| 2009/0284288 A1* | 11/2009 | Zhang et al. | ............ | 327/118 |

OTHER PUBLICATIONS

Wang, Huaide, et al., "A 21-Gb/s 87-m Transceiver with FFE/DFE/Linear Equalizer in 65-mn CMOS Technology", Symposium on VLSI Circuits Digest of Technical Papers, 2009, (2009) pp. 50-51.

* cited by examiner

*Primary Examiner* — Rexford N Barnie
*Assistant Examiner* — Thienvu V Tran
(74) *Attorney, Agent, or Firm* — Blakely, Sokoloff, Taylor & Zafman LLP

(57) ABSTRACT

Embodiments of the invention relate generally to the field of duty cycle correction, and more particularly to method and apparatus for correcting duty cycle of a CMOS level signal when converted from a Current-Mode-Logic (CML) to a CMOS level signal via a CML to CMOS converter. The converter comprises a first differential pair unit to receive a CML level signal; a second differential pair unit to receive the CML level signal; and an embedded differential biasing unit, coupled with the first and the second differential pair units, to adjust drive strength of the first and second differential pair units based on a duty cycle of the CML level signal. The method for correcting duty cycle of the CMOS level signal output comprises receiving by the first differential pair unit a CML level signal; receiving by the second differential pair unit the CML level signal; and adjusting drive strength of the first and the second differential pair units based on a duty cycle of the CMOS level signal.

19 Claims, 6 Drawing Sheets

METHOD AND APPARATUS FOR CORRECTING DUTY CYCLE VIA CURRENT MODE LOGIC TO CMOS CONVERTER

FIELD OF THE INVENTION

Embodiments of the invention relate generally to the field of duty cycle correction, and more particularly to method and apparatus for correcting duty cycle of a CMOS level signal when converted from a Current-Mode-Logic (CML) to a CMOS level signal via a CML to CMOS converter.

BACKGROUND

As the speed/bandwidth at which the input-output (I/O) circuits operate is increasing, circuits associated with such I/Os become sensitive to duty cycle and voltage swings of associated signals. Timing uncertainty of high speed clock signals, including power supply induced jitter and clock duty cycle error caused by mismatch between adjacent transistors arising from manufacturing variations, limit the overall operating data rate of high speed serial I/Os. To overcome such limitation in overall operating data rate, low signal swing clock signals are used for I/O circuits because such low swing signals are more robust against power supply induced jitter. These low signal swing signals are called Current-Mode-Logic (CML) level signals. CML level signals generally operate at voltage swings which are around 30-40% of the full power supply rail/voltage level.

However the end use point of these clock signals is usually CMOS level logic circuits, requiring rail-to-rail voltage swings. Some circuits provide better performance via CMOS level signals with a 50% duty cycle. A signal with 50% duty cycle is a signal that remains high and low for the same duration of time in a signal period. A signal with more than 50% duty cycle is a signal that has a longer high pulse than its corresponding low pulse in a signal period. Similarly, a signal with less than 50% duty cycle is a signal that has a longer low pulse than its corresponding high pulse in a signal period.

For such circuits that require CMOS level signals, the CML level signals are converted to CMOS level signals, which are rail-to-rail signals, at the input of these circuits. For example, transmitters and receivers of Peripheral Component Interconnect Express (PCIe) I/O circuits require CMOS level signals with 50% duty cycle and reduced signal jitter for proper operation at high frequencies (e.g., 4 GHz and above). These CML to CMOS level signal converters introduce performance limiting characteristics to the output CMOS level signals. Examples of performance limiting characteristics include higher power consumption, lower timing margin, non-50% duty cycle, increased jitter amplification, power supply induced jitter, etc.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention discuss method and apparatus for correcting duty cycle of a CMOS level signal when converted from a Current-Mode-Logic (CML) to a CMOS level signal via a CML to CMOS signal converter.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Figure 1A:
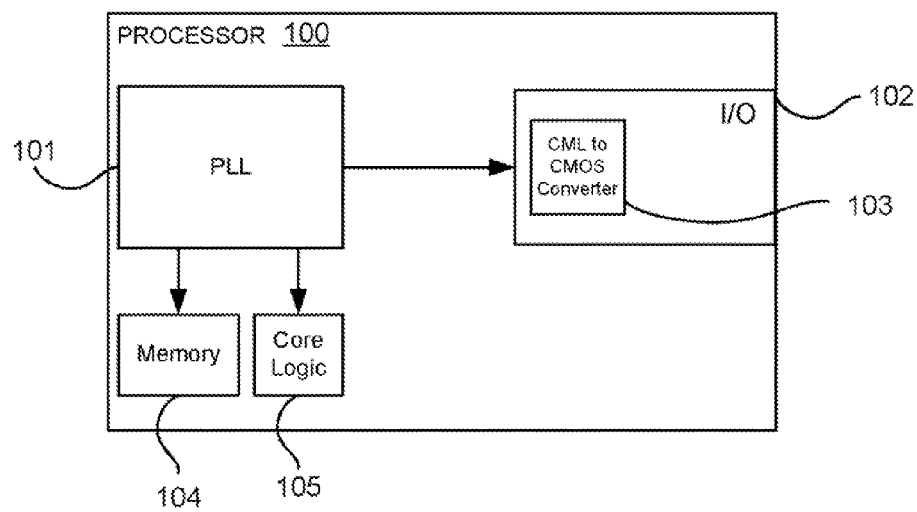
FIG. 1A illustrates a processor having a CML to CMOS signal level converter, according to one embodiment of the invention.

FIG. 1A illustrates a processor 100 having a CML to CMOS signal level converter, according to one embodiment of the invention. In one embodiment, a phase locked loop (PLL) unit 101 generates a clock signal. In one embodiment, the clock signal is converted to low swing signal such as a CML level signal by a converter (not shown) which resides inside the PLL unit 101 or outside the PLL unit 101. In one embodiment, the CML level signal is received by an I/O buffer 102. In one embodiment, the I/O unit 102 includes a CML to CMOS signal level converter 103 which is discussed later. In one embodiment the processor 100 includes a memory 104 (e.g., a Random Access Memory) to store computer executable instructions which are executed by the core logic 105. In one embodiment, the computer executable instructions when executed perform a method which is discussed in FIG. 6.

Figure 1B:
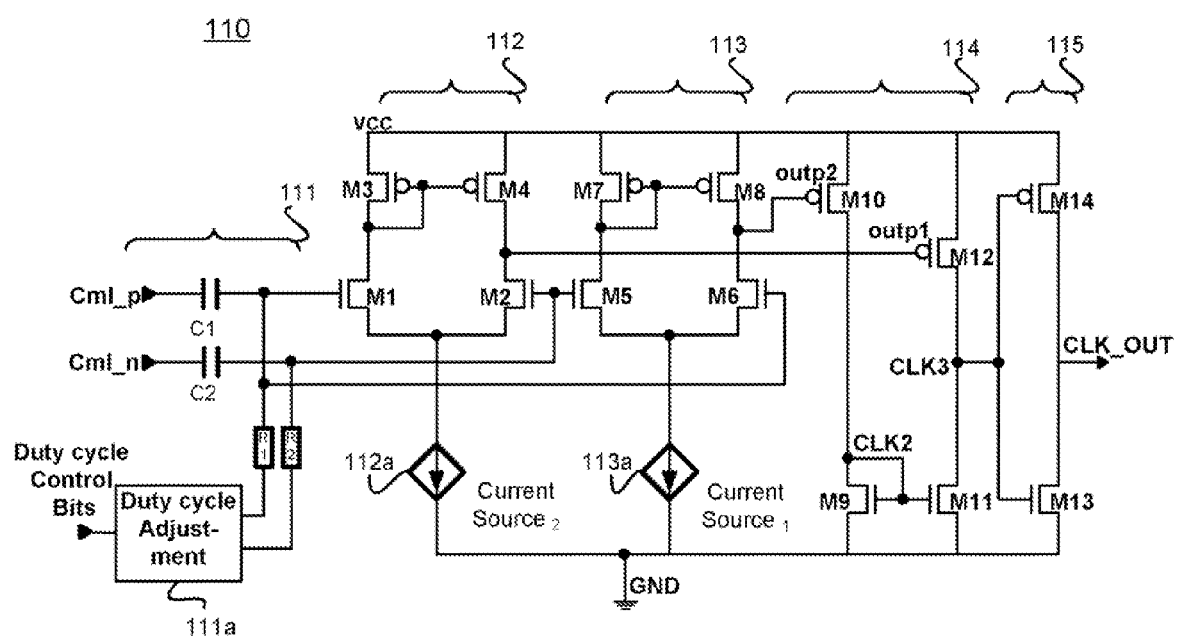
FIG. 1B illustrates a CML to CMOS signal level converter, according to one embodiment of the invention.

FIG. 1B illustrates a CML to CMOS signal level converter 110, according to one embodiment of the invention. In one embodiment, the converter 110 receives differential CML level signals cml_p and cml_n via a receiver 111. In one embodiment, the receiver 111 includes an adjustable high pass filter. In one embodiment, the high pass filter includes adjustable capacitors C1-C2 and adjustable resistors R1-R2.

In one embodiment, the receiver 111 includes a duty cycle adjustment circuit 111a. In other embodiments, the duty cycle adjustment circuit 111a is outside the receiver 111.

In one embodiment, the duty cycle adjustment unit 111a adjusts the DC bias levels of signals at the gates of transistors M1, M6, M2, and M5. The adjusted DC bias levels further adjust the duty cycle of the CMOS level signals at the output. The term unit is interchangeably called circuit. In one embodiment, the duty cycle adjustment unit 111a in 111 is a digital to analog converter (DAC). The adjustment of the DC bias levels of signals at the gates of transistors M1, M6, M2, and MS are based on the duty cycle of the CMOS output signal CLK_OUT (or buffered version of that signal).

In one embodiment, the capacitors C1-C2 and resistors R1-R2 are adjusted by a digital logic (not shown) having multiplexers to select appropriate combination of capacitance and resistance for a particular input CML level signal frequency. In one embodiment, the capacitors C1-C2 and resistors R1-R2 are configured to have fixed values that are predetermined for a particular CML level signal frequency range. In one embodiment, the values for C1-C2 and R1-R2 are configured to be 200 fF and 10 KOhms respectively for CML level signals having frequency range of 4-5 GHz.

In one embodiment, the duty cycle control bits to the duty cycle adjustment block 111a lowers the difference between the DC bias levels of signals at the gate of transistors M1 and M6 and the DC bias levels of signals at the gate of transistors M2 and M5. In one embodiment, the lower difference in the DC bias levels increases the duty cycle of the output CMOS level signals In another embodiment, the duty cycle control bits to the duty cycle adjustment block 111a raise the DC bias levels of the signals at the gate of transistors M1 and M6 and lower DC bias levels of the signals at the gate of transistors M2 and M5. In one embodiment, the above adjustment of DC bias levels reduces the duty cycle of the output CMOS level signals. In one embodiment, the duty cycle control bits are set by hardware or software or both. In one embodiment, the duty cycle control bits are generated by a compensation unit discussed later in reference to FIG. 4.

Referring back to FIG. 1B, as discussed above the CML level signals cml_p and cml_n are coupled with a pair of differential amplifiers/units 112 and 113 via the receiver block 111. In one embodiment, the two differential pair amplifier/units are based on a current mirror architecture having transistors M1-M4 and M5-M8. Other implementations of differential pair amplifiers/units can be used without changing the principle of operation of the described embodiments. In one embodiment, each differential pair amplifier/unit 112 and 113 has its independent current sources 112a and 113a respectively.

In one embodiment, the differential amplifiers/units 112 and 113, are configured to receive complementary CML level input signals, i.e. transistor M1 of 112 receives cml_p while corresponding transistor M5 of 113 receives cml_n. Such configuration generates complementary output signals outp1 and outp2 of 112 and 113 respectively.

In one embodiment, the complementary output signals outp1 and outp2 are received by a differential-to-single-ended converter 114 that converts the differential outputs outp1 and outp2 to a single-ended output. In one embodiment, the differential-to-single-ended converter 114 is implemented as a current mirror architecture having transistors M9-M12. Other implementations of differential-to-single-ended converter can be used without changing the principle of operation of the described embodiments.

In one embodiment, the complementary differential outputs outp1 and outp2 compensate for non-50% duty cycle in the CML level signals by controlling the current in the differential-to-single-ended converter 114.

In one embodiment, the transistors M10 and M12 that receive the signals outp1 and outp2 are biased by the DC levels of the signals outp1 and outp2. The DC bias levels of the signals outp1 and outp2 also depend on the duty cycle adjustment unit 111a. In one embodiment, the DC bias level of outp1 increases when the DC bias level of the signals at the gate of transistors M1 and M6 increases. In one embodiment, the DC bias level of outp1 decreases when the DC bias level of the signals at the gate of transistors M1 and M6 decreases. In one embodiment, the DC bias level of outp2 increases when the DC bias level of the signals at the gate of transistors M2 and M5 increases. In one embodiment, the DC bias level of outp2 decreases when the DC bias level of the signals at the gate of transistors M2 and M5 decreases. The complementary nature of the signals outp1 and outp2 adjusts the duty cycle of the single-ended output CLK3 to be of 50% duty cycle.

The single-ended output from the differential-to-single-ended converter 114 is also in CMOS level, i.e. with rail-to-rail signal swing. In one embodiment, the differential-to-single-ended converter 114 is configured by appropriate device sizes to behave as a final driver of the CMOS level output signal. In such an embodiment, the differential-to-single-ended converter 114 amplifies the CMOS level output and thus limits the power supply induced jitter on the CMOS level output.

In one embodiment, the single-ended output CLK3 is driven out by a driver 115 coupled with the differential-to-single-ended converter 114. In one embodiment, the driver 115 is implemented as an inverter having transistors M13-M14. Other implementations of the driver 115 can be used without changing the principle of operation of the described embodiments. In one embodiment, the driver 115 inverts the polarity of the CMOS level signal from the differential-to-single-ended converter 114. The driver 115 amplifies the signal strength of the CMOS level signal and also limits the power supply induced jitter on the CMOS level output.

Figure 2A:
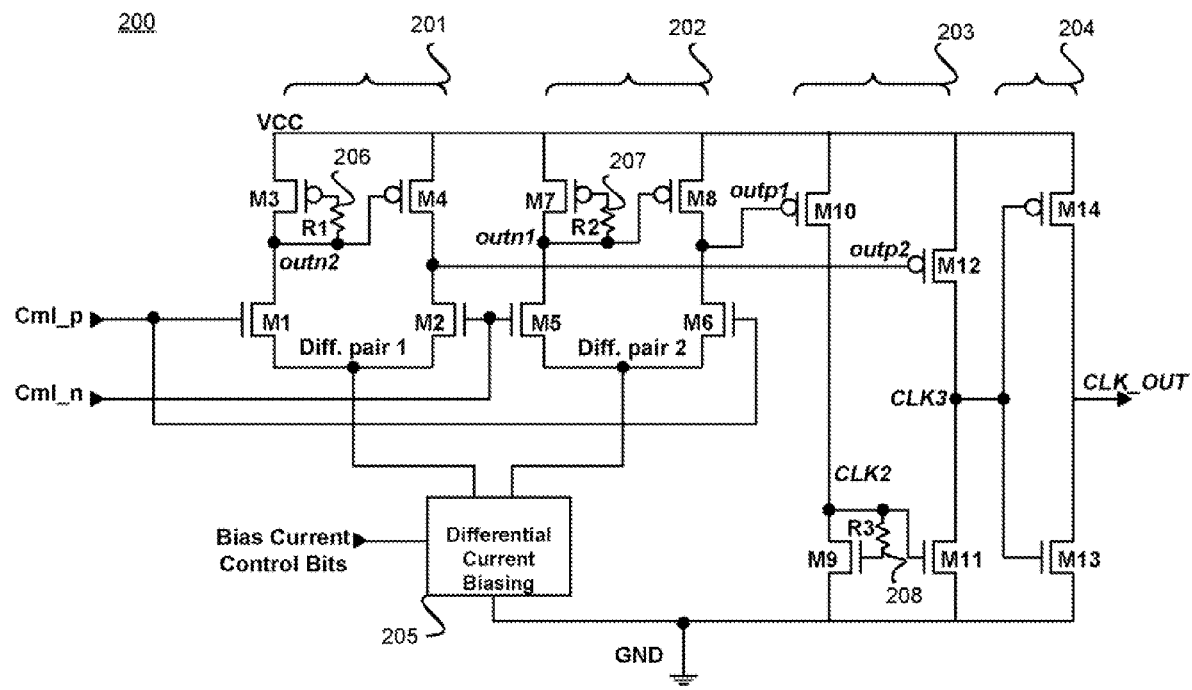
FIG. 2A illustrates a CML to CMOS signal level converter with differential biasing and gate shielding devices, according to one embodiment of the invention.

FIG. 2A illustrates a CML to CMOS signal level converter 200 with differential biasing and gate shielding devices, according to one embodiment of the invention. Compared to the embodiment of FIG. 1B, the CML to CMOS signal level converter of FIG. 2A includes an embedded duty cycle controller 205 (instead of independent current sources) that allows the CML level signals cml_p and cml_n to directly connect with a pair of differential amplifiers/units 201 and 202 while providing 50% duty cycle at the output of the converter 200.

In one embodiment, jitter amplification is reduced by shielding devices in the differential pairs 201 and 202, and differential-to-single-ended converter 203. In one embodiment, the shielding devices are inserted between the diode connection of the diode connected transistors M3, M7, and M9. In one embodiment, the shielding devices 206-208 are resistors R1-R3. In one embodiment, the resistors R1-R3 have adjustable resistance controlled by a logic circuit (not shown) which controls the amount of jitter amplification of the converter 200 at the cost of active area of the converter 200.

The shielding devices shield the gates of transistors M3, M7, and M9 from noise generated by high speed nodes outn1, outn2, and CLK2. In one embodiment, the nodes outn1, outn2, and CLK2 operate at the same frequencies as the frequencies of the input CML level signals cml_p and cml_n. By shielding the gates of transistors M3, M7, and M9, the effective dynamic capacitance, i.e. switching capacitance, of the converter 200 is reduced compared to when no shielding devices are inserted between the diode connection of the diode connected transistors M3, M7, and M9. A person skilled in the art knows that power consumption of a CMOS based circuit depends on power supply level, frequency of the signal, and the capacitance of the circuit. By reducing the active capacitance via the shielding devices, active power consumption is reduced for the converter 200. Furthermore, by reducing the active capacitance seen by outn2, outn1, and CLK2 nodes bandwidth of these nodes is increased.

An alternative way to understand the bandwidth enhancement of the converter 200 is via the low frequency output impedance of the diode connected transistors M3, M7, and M9. The low frequency (near DC) output impedance of the diode connected transistors M3, M7, and M9 is the inverse of their trans-conductance (1/gm) while the output impedance at high frequencies (e.g., 4 GHz and above) is 1/gds. The output impedance of 1/gds is higher than the output impedance of 1/gm. This means that at high CML level signal frequency (e.g., 4 GHz and above), the output impedance increases gain of the converter 200. The shielding resistors 206-208 enhance bandwidth of the converter 200 because the amount of capacitance observed by nodes outn2, outn1, and CLK2 is reduced.

In one embodiment, the gate shielding resistors R1-R3 are set to 10 K Ohms for an input CML level signal frequency of 4-5 GHz to generate a CMOS level signal having 50% duty cycle and reduced jitter amplification. In such an embodiment, the bandwidth of the nodes outn2, outn1, and CLK2, and hence the bandwidth of the converter 200, is increased by 25% versus when no shielding devices are used. Furthermore, the 25% increase in bandwidth is realized without any additional power consumption because it is not based on the resistance values. Instead, in one embodiment, active power consumption is reduced by 5% because the nodes outn1, outn2, and CLK2 now see less gate capacitance (of transistor gates M3, M7, and M9).

The embedded duty cycle converter 205 controls the amount of current that flows through the differential amplifiers/units 201 and 202. In one embodiment, the CML level signals cml_p and cml_n are directly connected with the pair of differential amplifiers/units 201 and 202. In one embodiment, the two differential pair amplifiers/units 201 and 202 are based on a current mirror architecture having transistors M1-M4 and M5-M8. Other implementations of differential pair amplifiers/units can be used without changing the principle of operation of the described embodiments.

In one embodiment, the differential amplifiers/units 201 and 202, are configured to receive complementary CML level input signals, i.e. transistor M1 of 201 receives cml_p while corresponding transistor M5 of 202 receives cml_n. Such configuration generates complementary output signals outp1 and outp2 of 201 and 202, respectively.

In one embodiment, the complementary output signals outp1 and outp2 are received by a differential-to-single-ended converter 203 that converts the differential outputs outp1 and outp2 to a single-ended output CLK3. In one embodiment, the differential-to-single-ended converter 203 is implemented as a current mirror architecture having transistors M9-M12. Other implementations of differential-to-single-ended converter can be used without changing the principle of operation of the described embodiments.

In one embodiment, the complementary differential outputs outp1 and outp2 compensate for non-50% duty cycle in the CML level signals by controlling the current in the differential-to-single-ended converter 203.

In one embodiment, the differential-to-single-ended converter 203 behaves as a gain stage in the CML to CMOS level signal converter. The gain generated by the differential-to-single-ended converter 203 enhances the overall gain of the converter 200. A higher gain of the converter 200 limits power supply induced jitter because the gain increases the slew rate of the CMOS level signal. In one embodiment, the differential-to-single-ended converter 203 also operates as a driver of the CMOS level signal. The complementary differential outputs outp1 and outp2 compensate for non-50% duty cycle in the CML level signals by controlling the current in the differential-to-single-ended converter 203.

In one embodiment, transistors M10 and M12 of the differential-to-single-ended converter 203 receive signals outp1 and outp2 from the differential pairs 201 and 202. In one embodiment, the signals outp1 and outp2 are indirectly biased by the differential current biasing circuit 205. The complementary nature of the signals outp1 and outp2 adjusts the duty cycle of the single-ended output CLK3 to be of 50% duty cycle.

In one embodiment, the single-ended output CLK3 is driven out by a driver 204 coupled with the differential-to-single-ended converter 203. In one embodiment, the driver 204 is implemented as an inverter having transistors M13-M14. Other implementations of the driver 204 can be used without changing the principle of operation of the described embodiments. In one embodiment, the driver 204 inverts the polarity of the CMOS level signal from the differential-to-single-ended converter 203. The driver 204 amplifies the signal strength of the CMOS level signal and also limits the power supply induced jitter on the CMOS level output. In one embodiment, the driver 204 inverts the polarity of the CMOS level signal from the differential-to-single-ended converter 203.

In one embodiment, the signal strength of node outp1 verses that of node outp2 is scaled by controlling the bias current of the differential pair units 201 and 202. The scaling of the current is performed by the differential current biasing unit 205. In one embodiment, the difference in signal strength of outp1 and outp2 and the DC voltage levels (bias level) at nodes outp1 and outp2 determine the duty cycle of the output CLK3 and CLK_OUT.

In one embodiment, the tail current to the differential pair 201 is increased by the differential current biasing unit 205 while the tail current to the differential pair 202 is decreased by the differential current biasing unit 205. As a result of the difference in the tail currents of the differential pair units 201 and 202, the signal swing at node outp2 becomes larger than it was before the increase in the tail current of the differential pair unit 201 and before the decrease in tail current of the differential pair unit 202. In one embodiment, the increase in signal swing at node outp2 causes the duty cycle at node CLK3 (output of the differential-to-single-ended converter 203) to be increased. In one embodiment, the differential-to-single-ended converter 203 is followed by a driver 204. In such an embodiment, the duty cycle of the output CLK_OUT of the driver 204 is decreased.

In one embodiment, the tail current to the differential pair unit 201 is decreased by the differential current biasing unit 205 while the tail current to the differential pair unit 202 is increased by the differential current biasing unit 205. As a result of the difference in the tail currents of the differential pair units 201 and 202, the signal swing at node outp2 becomes smaller than it was before the decrease in the tail current of the differential pair unit 201 and before the increase in tail current of the differential pair unit 202. In one embodiment, the decrease in signal swing at node outp2 causes the duty cycle at node CLK3 (output of the differential-to-single-ended converter 203) to be decreased. In one embodiment, the differential-to-single-ended converter 203 is followed by a driver 204. In such an embodiment, the duty cycle of the output CLK_OUT of the driver 204 is increased.

In one embodiment, the embedded differential current biasing unit 205 is controlled by bias current control bits. In one embodiment, the values of the current control bits are controlled by software. In another embodiment, the values of the current control bits are controlled by hardware. In yet another embodiment, both hardware and software are used to control the values of the current control bits. The control mechanism is later discussed in reference to FIG. 5.

In one embodiment, the embedded differential current biasing unit 205 does not interfere with the high speed path of the CML to CMOS signal level converter. Details of an embodiment of the embedded differential current biasing unit 205 are later discussed in reference to FIG. 3A. The embodiment 200 of FIG. 2A consumes less power than the embodiment of FIG. 1B because the duty cycle adjustment circuit and capacitors C1-C2 are not used.

Figure 2B:
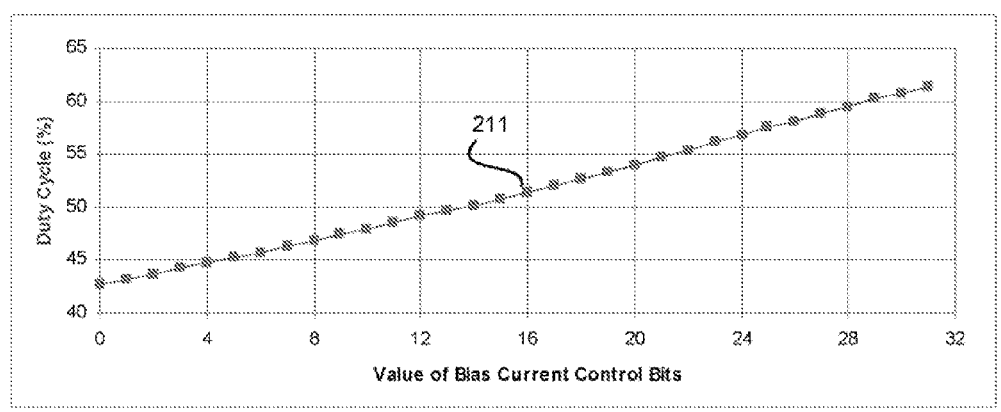
FIG. 2B illustrates duty cycle performance of a CML to CMOS signal level converter with an embedded differential biasing unit and gate shielding devices, according to one embodiment of the invention.

FIG. 2B illustrates via a graph 210 the duty cycle performance of a CML to CMOS signal level converter, according to the embodiment described in FIG. 2A. The x-axis of the graph list values of the bias current control bits. These bits control the currents of embedded differential current biasing unit 205 which in turn control the tail currents of the differential pair units 201 and 202. The y-axis of the graph lists the duty cycle in percentage at node CLK_OUT. The CML to CMOS level signal converter 200 of FIG. 2A provides a monotonic response 211 to duty cycle for the control bits. In this example, 50% duty cycle is achieved near control bit setting of 16. In one embodiment, the setting of the control bit is achieved by a compensation unit discussed later in reference to FIG. 5.

Figure 3A:
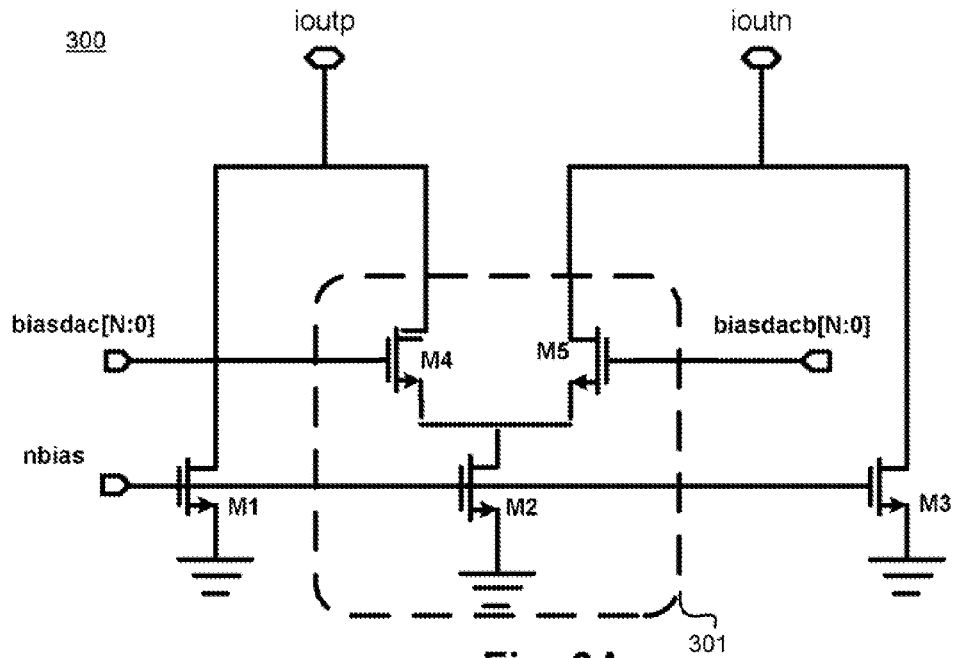
FIG. 3A illustrates an embedded differential biasing unit, according to one embodiment of the invention.

FIG. 3A illustrates an embedded differential biasing circuit/unit 300, according to one embodiment of the invention. In one embodiment, the embedded current source 301 provides current sources to both the differential pair units 201 and 202 of FIG. 2A. The outputs of the embedded current source 301 are shown as ioutp and ioutn which are connected with tail current nodes of differential pair units 201 and 202 of FIG. 2A. In one embodiment, the current strength for these outputs is independently controlled by control bits. In one embodiment, the control bits are complementary bits, i.e. control bits (biasdac[N:0]) are of opposite polarity to the control bits biasdacb[N:0], where N is the number of control bits that are individually controlling transistors M4 and M5. In one embodiment, transistors M1 and M3 are configured to provide a minimum static current to the differential pairs 201 and 202. The embedded current source 301 has a maximum current sourcing capacity set by transistor M2 which is biased by nbias. In one embodiment, nbias is an analog voltage generated by a bias circuit (not shown) such as a band-gap circuit.

Figure 3B:
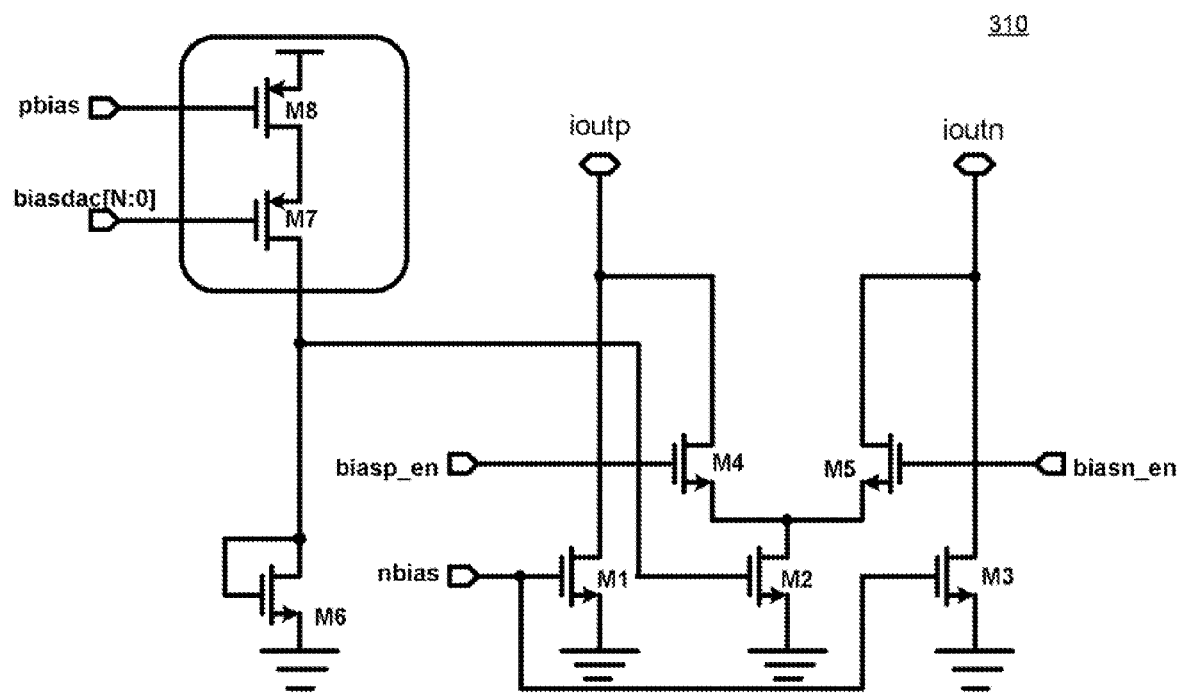
FIG. 3B illustrates an alternative embedded differential biasing unit, according to one embodiment of the invention.

FIG. 3B illustrates an embedded differential biasing circuit/unit 310, according to one embodiment of the invention. This circuit is explained later in detail as an alternative to the embedded differential biasing circuit/unit 300 of FIG. 3A.

Figure 4:
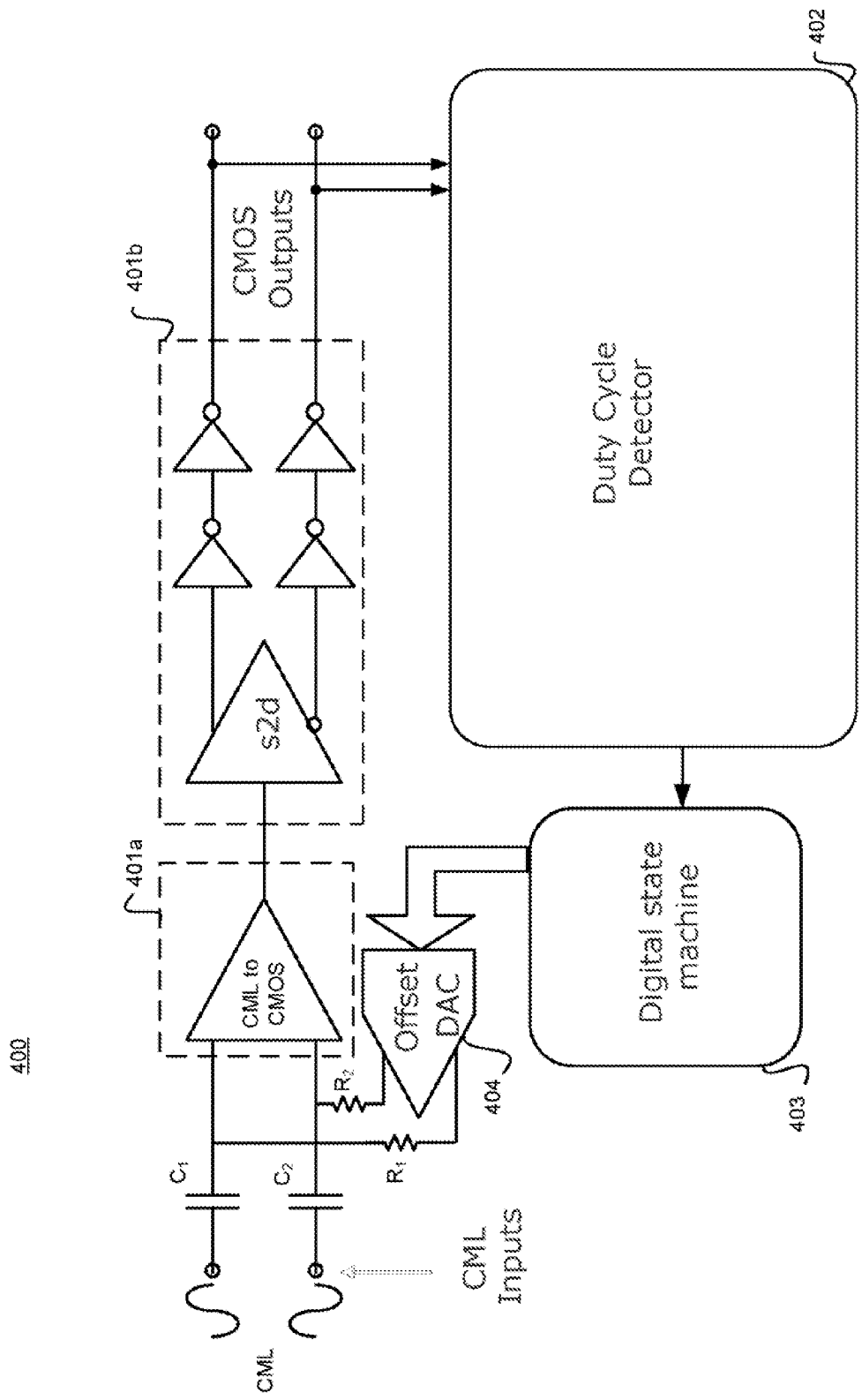
FIG. 4 illustrates a compensation scheme for compensating duty cycle via a CML to CMOS signal level converter, according to one embodiment of the invention.

FIG. 4 illustrates a compensation scheme 400 for compensating duty cycle via a CML to CMOS signal level converter, according to one embodiment of the invention. In one embodiment, a CML to CMOS level signal converter 401a is compensated for a 50% duty cycle over process, voltage, and temperature (PVT) conditions. In one embodiment, the converter 401a is the same as the converter 110 of FIG. 1B. In one embodiment, the CMOS level signal from the converter 401a is converted to differential signals by single-to-differential converter 401b. In one embodiment, the output of the single-to-differential converter 401b is detected by a duty cycle detector 402. In one embodiment, the output of the duty cycle detector 402 is received by a finite state machine (FSM) 403. The FSM 403 determines the appropriate DC control bit setting for the DC adjustment circuit 405 of the receiver 111 of FIG. 1B. In one embodiment, the loop (401a→401b→402→403→404→401a) is repeated regularly to provide duty cycle control bit settings for a PVT condition so that the CML to CMOS level signal converters provide 50% duty cycle CMOS level signals.

Figure 5:
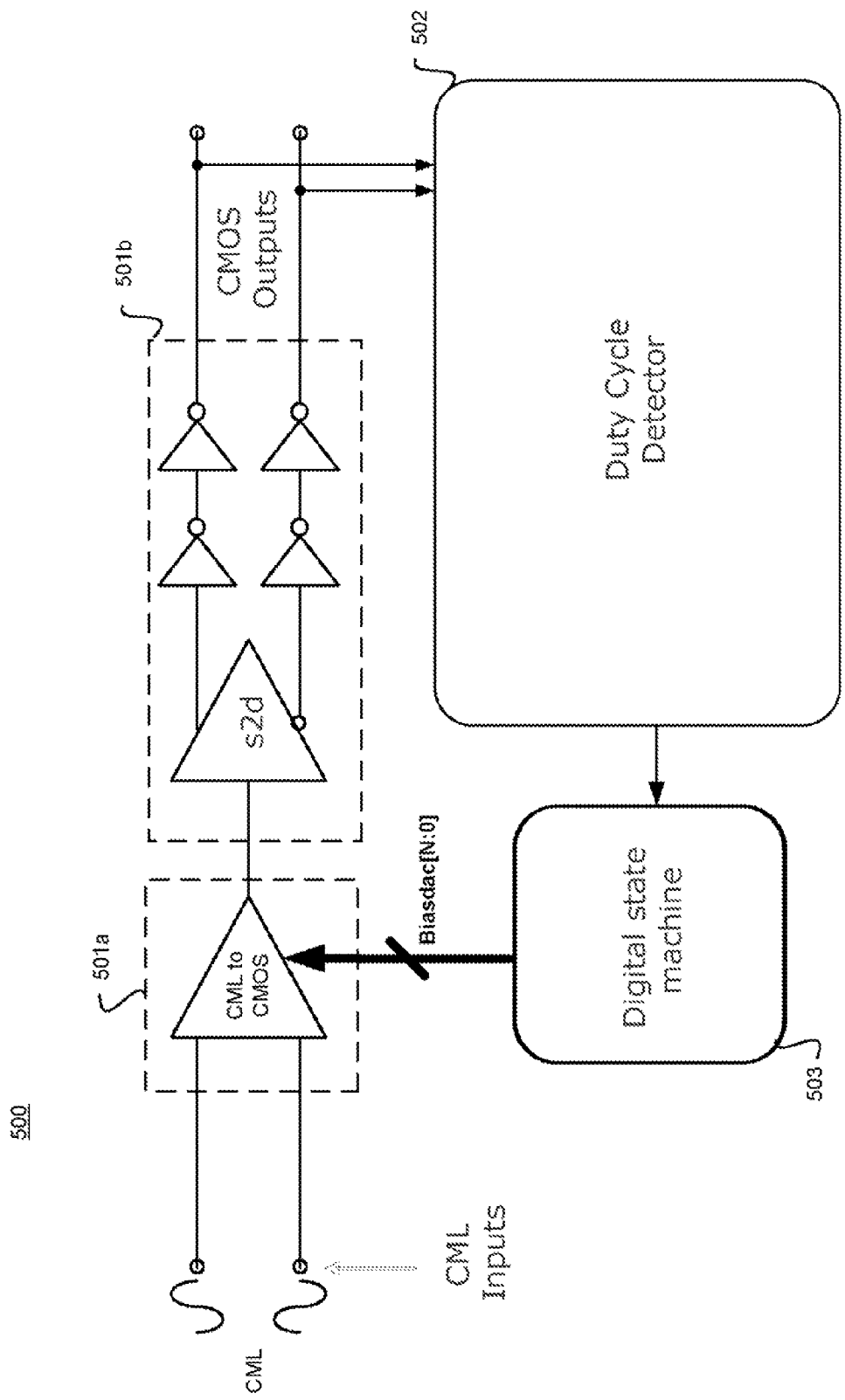
FIG. 5 illustrates a compensation scheme for compensating duty cycle via a CML to CMOS signal level converter having an embedded differential biasing unit and gate shielding devices, according to one embodiment of the invention.

FIG. 5 illustrates a compensation scheme 500 for compensating duty cycle via a CML to CMOS level signal converter 501a having an embedded differential biasing unit and gate shielding devices, according to one embodiment of the invention. In one embodiment, a CML to CMOS level signal converter 501b is compensated for a 50% duty cycle over PVT conditions. In one embodiment, the converter 501b is the same as the converter 200 of FIG. 2A. In one embodiment, the CMOS level signal from the converter 501a is converted to differential signals by a single-to-differential converter 501b. In one embodiment, the output of the single-to-differential converter 501b is detected by a duty cycle detector 502. In one embodiment, the output of the duty cycle detector 502 is received by a finite state machine (FSM) 503. The FSM 503 determines the appropriate biasdac bit setting for the embedded differential bias current source of FIG. 2A. In one embodiment, the loop (501a→501b→502→503→501a) is repeated regularly to provide biasdac settings for a PVT condition so that the CML to CMOS level signal converters provide 50% duty cycle CMOS level signals.

Figure 6:
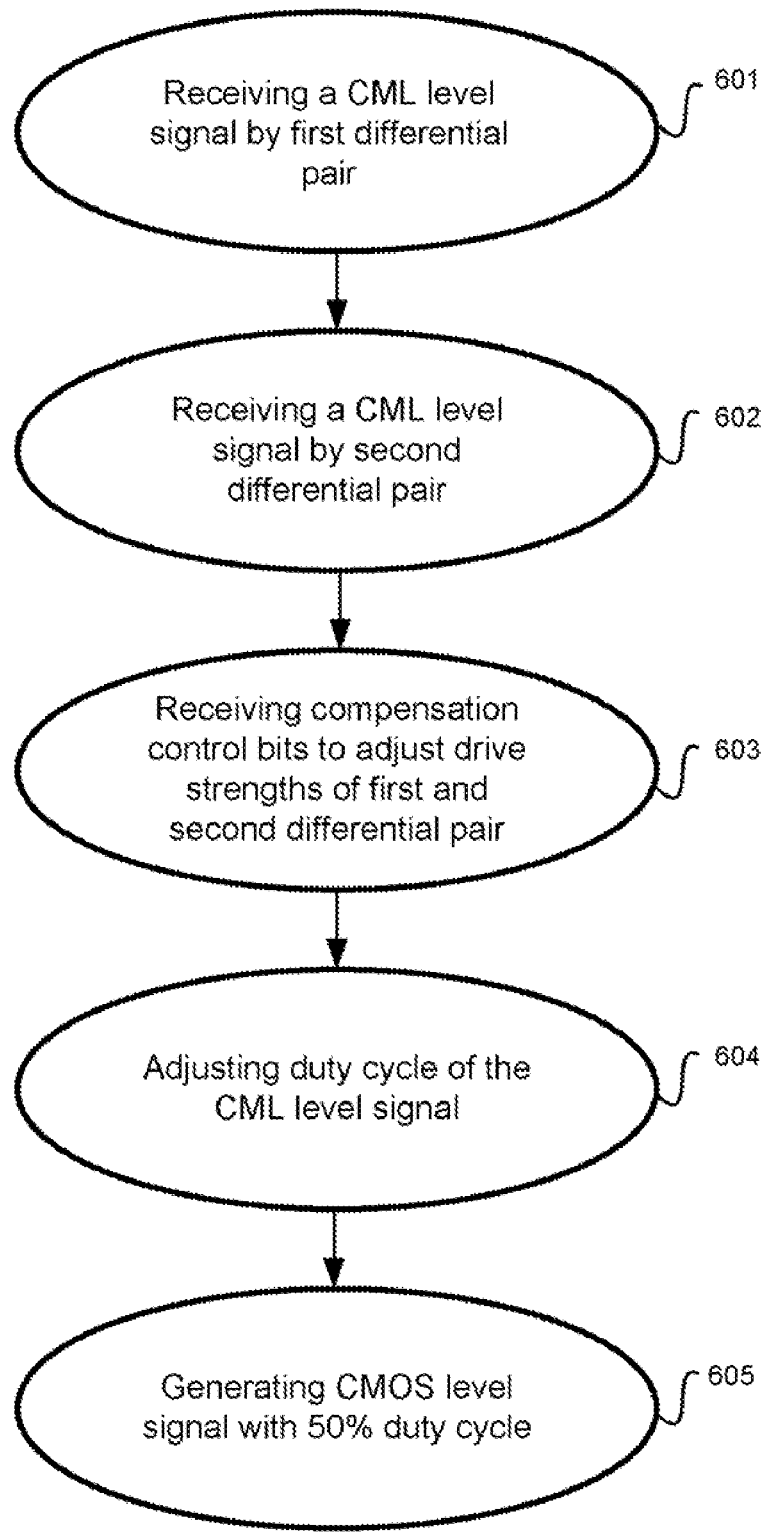
FIG. 6 illustrates a flow chart for generating a 50% duty cycle CMOS level signal via a CML to CMOS signal level converter, according to one embodiment of the invention.

FIG. 6 illustrates a flow chart 600 for generating a 50% duty cycle CMOS level signal via a CML to CMOS signal level converter, according to one embodiment of the invention. The flow chart 600 is applicable to converters 110 and 200 of FIG. 1B and FIG. 2A respectively. At block 601, CML level signals are received by the first differential pair (111 of FIG. 1B, 201 of FIG. 2A). At block 602, CML level signals are received by the second differential pair (112 of FIG. 1B, 202 of FIG. 2A). At block 603, compensation control bits to adjust drive strengths of the first and the second differential pairs are received. In one embodiment, the compensation control bits are the duty cycle control bits generated by the compensation unit 400 of FIG. 4 for the converter 110 of FIG. 1B. In one embodiment, the compensation control bits are duty cycle control bits generated by the compensation unit 500 of FIG. 5 for the converter 200 of FIG. 2A. At block 604, the duty cycle of the CMOS level signal is adjusted to be 50% duty cycle based on the compensation control bits. At block 605, the converter generates a 50% CMOS level signal.

Elements of embodiments are also provided as a machine-readable medium (e.g., 104 of FIG. 1A) for storing the computer-executable instructions (e.g., setting the control bits for biasing the embedded differential biasing circuits 300 and 310 of FIG. 3A and FIG. 3B, setting the duty cycle adjustment bits in the CML to CMOS level signal converter 200 of FIG. 2A). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

While the invention has been described in conjunction with specific embodiments thereof, many alternatives, modifications and variations will be apparent to those of ordinary skill in the art in light of the foregoing description.

For example, in one embodiment, the embedded differential biasing unit/circuit 300 of FIG. 3A can be implemented as the circuit shown in FIG. 3B. FIG. 3B illustrates an embedded differential biasing circuit 310, according to one embodiment of the invention. This embodiment biases the source transistor M5 by pbias and the biasdac[N:0]. In one embodiment, to increase sourcing of current at connections ioutp and ioutn (which are both connected to differential pair 201 and 202 respectively of FIG. 2A) biasdac[N:0] controls the current strength of transistor M7. In one embodiment, the DC level of pbias which is connected with the gate of transistor M8 determines the maximum amount of current that the embedded differential biasing circuit 300 can sink via transistor M5. In one embodiment, pbias is generated by a bias circuit (not shown) such as a band-gap circuit.

In one embodiment, transistors M4 and M5, which in FIG. 3A were N transistors each controlled by biasdac[N:0] and its complementary control bits, are no longer controlled by biasdac[N:0] control bits. Instead, the complementary function of biasdac[N:0] of FIG. 3A is implemented via the bias enable signals biasp_en and biasn_en. In one embodiment, both biasp_en and biasn_en are complementary to one another. In one embodiment, transistors M1 and M3 are configured to provide a minimum static current to the differential pair units 201 and 202 of FIG. 2A. By having the ability to control the tail current of differential pairs units 201 and 202 of FIG. 2A via ioutp and ioutn, the duty cycle of the CMOS level signal is adjusted.

While the CML to CMOS level signal converter of FIG. 1B and FIG. 2A are implemented as NMOS input based differential amplifiers/units, PMOS input based differential amplifiers/units can easily replace the NMOS based differential amplifiers/units without changing the essence of the embodiments of the invention.

Similarly, the NMOS bias generation circuits/units of FIG. 3A and FIG. 3B can be easily replaced with PMOS bias generation circuits/units without changing the essence of the embodiments of the invention. Embodiments of the invention are intended to embrace all such alternatives, modifications, and variations as to fall within the broad scope of the appended claims.

We claim:

1. An apparatus comprising:
a first differential pair unit to receive a current mode logic (CML) level signal;
a second differential pair unit to receive the CML level signal,
wherein each of the first and second differential pair units include corresponding gate shielding devices to isolate transistor gate terminal capacitances from the CML level signal, and
wherein the corresponding gate shielding devices couple a gate terminal and a drain terminal of a transistor of the first and second differential pair units; and
an embedded differential biasing unit, coupled with the first and the second differential pair units, to adjust drive strength of the first and the second differential pair units.

2. The apparatus of claim 1, further comprising:
a differential-to-single-ended converter having a gate shielding device, coupled with the first and second differential pair units, to generate a CMOS level output corresponding to the CML level signal; and
a driver, coupled with the differential-to-single-ended, to amplify the CMOS level output.

3. The apparatus of claim 2, wherein the CMOS level output is a differential CMOS level output corresponding to the CML level signal.

4. The apparatus of claim 2, wherein the gate shielding device is one or more resistors.

5. The apparatus of claim 1, wherein the corresponding gate shielding devices comprise one or more resistors.

6. The apparatus of claim 1, wherein the embedded differential biasing unit is operable to receive control bits to adjust current strength of the embedded differential biasing unit.

7. The apparatus of claim 6, wherein the control bits to adjust current strength of the embedded differential biasing unit are derived from a duty cycle compensation unit.

8. The apparatus of claim 1, wherein adjusting the drive strength of the first and the second differential pair units is based on a duty cycle of the CMOS level signal.

9. A processor comprising:
a phase locked loop unit to generate a current mode logic (CML) level signal; and
an input-output (I/O) unit to receive the CML level signal, the I/O unit having:
a first differential pair unit to receive the CML level signal;
a second differential pair unit to receive the CML level signal,
wherein each of the first and second differential pair units include corresponding gate shielding devices to isolate transistor gate terminal capacitances from the CML level signal, and
wherein the corresponding gate shielding devices couple a gate terminal and a drain terminal of a transistor of the first and second differential pair units; and
an embedded differential biasing unit, coupled with the first and the second differential pair units, to adjust drive strength of the first and second differential pair units.

10. The processor of claim 9, further comprising:
a differential-to-single-ended converter having a gate shielding device, coupled with the first and second differential pair units, to generate a CMOS level output corresponding to the CML level signal; and
a driver, coupled with the differential-to-single-ended, to amplify the CMOS level output.

11. The processor of claim 10, wherein the CMOS level output is a differential CMOS level output corresponding to the CML level signal.

12. The processor of claim 10, wherein the gate shielding device is one or more resistors.

13. The processor of claim 9, wherein the corresponding gate shielding devices comprise one or more resistors.

14. A method comprising:
receiving by a first differential pair unit a current mode logic (CML) level signal;
receiving by a second differential pair unit the CML level signal;
isolating transistor gate terminals capacitances from the CML level signal via gate shielding devices of the first and second differential pair units, wherein the gate shielding devices couple a gate terminal and a drain terminal of a transistor of the first and second differential pair units; and adjusting drive strength of the first and the second differential pair units.

15. The method of claim 14, further comprising:
generating a CMOS level output corresponding to the CML level signal.

16. The method of claim 14, wherein the gate shielding devices of the first and second differential pair units include one or more resistors.

17. The method of claim 14, further comprising:
receiving control bits to adjust current strength of the first and the second differential pair units.

18. The method of claim 17, further comprising:
deriving control bits from a duty cycle compensation unit; and
compensating the duty cycle of the CML level signal for process, temperature, and voltage variations, the compensating based on the derived control bits.

19. The method of claim 14, wherein adjusting the drive strength of the first and the second differential pair units is based on a duty cycle of the CMOS level signal.

* * * * *